United States Patent
Park et al.

(10) Patent No.: US 8,520,384 B2
(45) Date of Patent: Aug. 27, 2013

(54) HEAT DISSIPATING DEVICE

(75) Inventors: Kwan Woo Park, Changwon-si (KR); Seo Young Maeng, Changwon-si (KR)

(73) Assignee: LG Electronics Inc., Seoul (KR)

( * ) Notice: Subject to any disclaimer, the term of this patent is extended or adjusted under 35 U.S.C. 154(b) by 299 days.

(21) Appl. No.: 12/949,951

(22) Filed: Nov. 19, 2010

(65) Prior Publication Data

US 2011/0122582 A1 May 26, 2011

(30) Foreign Application Priority Data

Nov. 20, 2009 (KR) .................... 10-2009-0112820

(51) Int. Cl.
*H05K 7/20* (2006.01)
*F21V 29/02* (2006.01)

(52) U.S. Cl.
USPC ....... 361/695; 361/697; 361/679.48; 165/121

(58) Field of Classification Search
USPC .................. 361/695, 697, 679.48; 165/121
See application file for complete search history.

(56) References Cited

U.S. PATENT DOCUMENTS

| | | | | |
|---|---|---|---|---|
| 4,595,338 A | * | 6/1986 | Kolm et al. ............... | 416/81 |
| 4,751,713 A | * | 6/1988 | Affleck ...................... | 372/59 |
| 4,923,000 A | * | 5/1990 | Nelson ....................... | 165/122 |
| 5,008,582 A | * | 4/1991 | Tanuma et al. ............ | 310/332 |
| 5,335,143 A | * | 8/1994 | Maling et al. ............. | 361/694 |
| 6,713,942 B2 | * | 3/2004 | Raman et al. ............ | 310/316.01 |
| 7,031,155 B2 | * | 4/2006 | Sauciuc et al. ............ | 361/695 |
| 7,321,184 B2 | * | 1/2008 | Lee et al. ................... | 310/341 |
| 7,550,901 B2 | * | 6/2009 | Chrysler et al. ........... | 310/330 |
| 7,714,433 B2 | * | 5/2010 | Campini et al. ............ | 257/722 |
| 7,771,167 B2 | * | 8/2010 | Fu .............................. | 416/100 |
| 2004/0190305 A1 | * | 9/2004 | Arik et al. .................. | 362/555 |
| 2004/0207292 A1 | * | 10/2004 | Scher et al. ................ | 310/328 |
| 2004/0253130 A1 | * | 12/2004 | Sauciuc et al. ............ | 417/436 |
| 2005/0266295 A1 | * | 12/2005 | Takai ......................... | 429/38 |
| 2008/0217764 A1 | * | 9/2008 | Campini et al. ............ | 257/721 |
| 2008/0304966 A1 | * | 12/2008 | Fu .............................. | 416/132 R |
| 2011/0052394 A1 | * | 3/2011 | Kalhofer .................... | 416/100 |

FOREIGN PATENT DOCUMENTS

| | | | | |
|---|---|---|---|---|
| JP | 01233796 | A | * | 9/1989 |
| JP | 02049999 | A | * | 2/1990 |
| JP | 02181957 | A | * | 7/1990 |

* cited by examiner

*Primary Examiner* — Anatoly Vortman
(74) *Attorney, Agent, or Firm* — KED & Associates, LLP

(57) ABSTRACT

The present invention relates to a heat dissipating device. More particularly, the present invention relates to a heat dissipating device in which an air flow is directed to a heat dissipating member by alternating rotation of blades within a preset range of angle for making a driving unit and a device thereof smaller, and improving heat dissipating efficiency.

13 Claims, 9 Drawing Sheets

HEAT DISSIPATING DEVICE

CROSS-REFERENCE TO RELATED APPLICATION(S)

Pursuant to 35 U.S.C. §119(a), this application claims the benefit of earlier filing date and right of priority to Korean Patent Application No. 10-2009-0112820, filed on Nov. 20, 2009, the contents of which are hereby incorporated by reference herein in their entirety.

BACKGROUND

1. Field of the Disclosure

The present invention relates to a heat dissipating device for improving heat dissipating efficiency. More particularly, the present invention relates to a heat dissipating device in which an air flow is directed to a heat dissipating member by alternating rotation of blades within a preset range of angles such that the size of the drive unit and a device therefor may be reduced, and the heat dissipating efficiency may be improved.

2. Discussion of the Related Art

Recently, electronic devices, such as lighting apparatuses, display devices, handheld terminals, and so on, operate at increasingly faster speeds to increase performance and are quickly becoming thinner, shorter and smaller than before.

Users of these electronic devices demand high performance as well as smaller sizes of the device, and technologies for integrating devices. The technologies of making a device to have a high performance and the integration of the devices are also applied to the electronic devices.

Since the electronic device increases its performance and speed increased heat is generated, increasing the failure rate of the electronic device, and necessitating the inclusion of a heat dissipation design of the electronic device.

Particularly, in a case of an LED, since an environmental temperature change affects the performance and a lifetime of the LED heavily, it is essential that the lighting apparatus of LED has effective heat dissipation.

Along with this, a heat dissipating device is required, which is to be attached to a heat generation region of the electronic device for easy dissipation of the heat from the heat generation region.

SUMMARY OF THE DISCLOSURE

Accordingly, the present invention is directed to a heat dissipating device that substantially obviates one or more problems due to limitations and disadvantages of the related art.

An object of the present invention is to provide a heat dissipating device which can improve heat dissipating efficiency.

Another object of the present invention is to provide a heat dissipating device which can make a size of a driving unit thereof smaller.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a heat dissipating device includes a heat dissipating member or heat dissipater thermally coupled to a heat generating unit or heat generator, for transmitting heat from the heat generating unit to the air, a blade that rotates to cause an air flow to at least a portion of the heat dissipating member, and a blade driving unit or blade drive that drives the blade to alternatingly rotate.

In this case, the blade driving unit includes a shaft, a bobbin connected to the shaft so as to be rotatable taking about a rotation axis or the shaft, the bobbin having the blade mounted to one side thereof, and an electromagnetic force generating unit having a coil configured to pass a current therethrough and at least one magnet spaced from the coil.

In this instance, the bobbin can have a guide portion formed thereon with the coil wound thereon.

Moreover, the at least one magnet can include a plurality of magnets each having a single pole arranged in succession such that adjacent magnets can have polarities different from each other.

In this instance, the plurality of magnets can be arranged to form a closed curve.

And, it is preferable that, when the bobbin is at a neutral position, a portion and the other portion of the coil wound on the guide portion are positioned opposite to adjacent magnets, respectively.

In this case, it is preferable that the current flowing to the coil at the time of operation of the blade driving unit is an alternating current.

Moreover, it is preferable that the current flowing to the coil has controllable intensity and cyclic time period.

And, the blade driving unit can further include a magnetic spring provided to the bobbin spaced from the magnets to have a restoring force applied thereto from the magnets in a direction density of the flux becomes minimum.

In this instance, the guide portion can have a recess formed therein for placing the magnetic spring therein.

And, the magnetic spring includes an iron piece, and the iron piece is positioned such that a center line of iron piece is opposite to a boundary line of adjacent magnets when the bobbin is at the neutral position.

Moreover, the blade driving unit can further include a housing having an upper structure of a container shape with openings at a side thereof and a lower structure of a plate shape coupled to the upper structure, wherein the shaft, the bobbin, and the electromagnetic force generating unit can be provided in the housing.

In this case, the upper structure and the lower structure have shaft guide portions formed therein for rotatably placing the shaft therein respectively, the bobbin and the magnets have pass through holes formed therein for placing in and passing through of the shaft respectively, and the shaft is fixedly secured to the pass through hole in the bobbin.

Moreover, the heat dissipating member has one surface in contact with the heat generating unit and the other surface with a plurality of heat dissipating fins provided on an edge thereof spaced from one another.

In this instance, the blades and the blade driving unit can be positioned in a space formed between the other surface of the heat dissipating member and the heat dissipating fins.

Moreover, in another aspect of the present invention, a heat dissipating device includes a heat sink having one surface in contact with a heat generating unit and the other surface having heat dissipating fins arranged on an edge thereof to form a space on an inner side of the heat dissipating fins, a plurality of blades positioned in the space that rotate, causing an air flow to cool down the heat dissipating fins, and a blade driving unit for causing the plurality of blades to alternately rotate within a preset range of angles by an electromagnetic force caused between a magnet and a coil.

In this instance, the heat generating unit can be one selected from an LED (Light Emitting Diode), a lighting apparatus, a CPU (Central Processing Unit)}, a Backlight unit, a display device, a hard disk drive, a handheld terminal, a notebook computer, a computer module, or a projector.

Moreover, in another aspect of the present invention, a heat dissipating device includes a heat sink having one surface and the other surface having heat dissipating fins arranged on an edge thereof to form a space on an inner side of the heat dissipating fins, a plurality of blades positioned in the space for making rotation to cause an air flow to cool down the heat dissipating fins, a blade driving unit for causing the plurality of blades to make alternating rotation within a preset range of angle by means of a force generated between a magnet and a coil to which a current flows, and an LED lighting module in contact with the one surface of the heat sink, the LED lighting module having at least one LED.

In this instance, the LED lighting module and the heat sink can be fastened together with fasteners.

Moreover, it is preferable that the other surface of the heat sink has an opening between adjacent heat dissipating fins for transmitting heat from the LED lighting module to the heat dissipating fins.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

Figure 1:
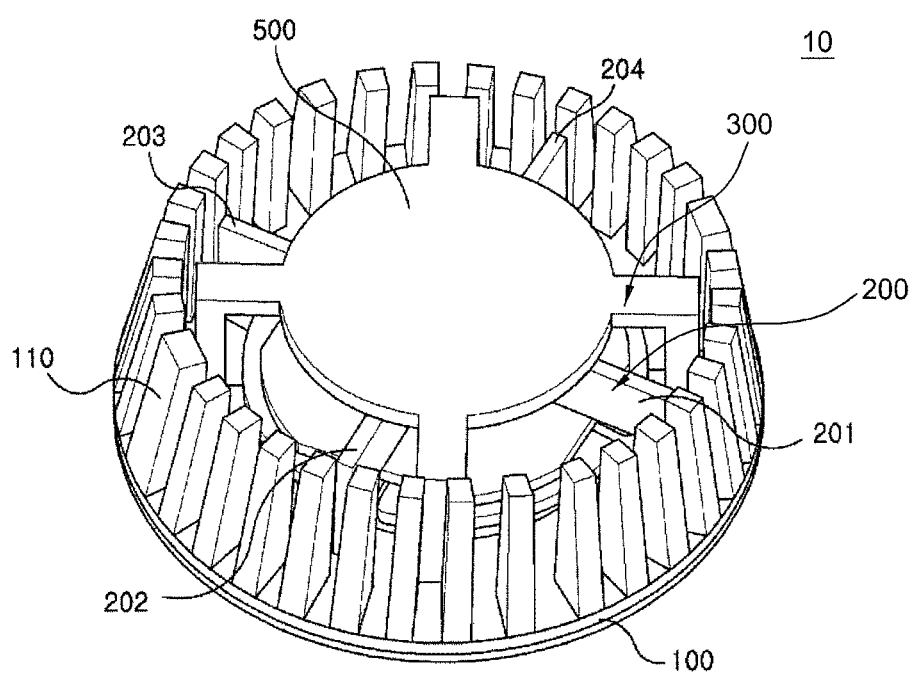
FIG. 1 illustrates a perspective view of a heat dissipating device in accordance with a preferred embodiment of the present invention.

FIG. 1 illustrates a perspective view of a heat dissipating device in accordance with a preferred embodiment of the present invention.

Figure 2A:
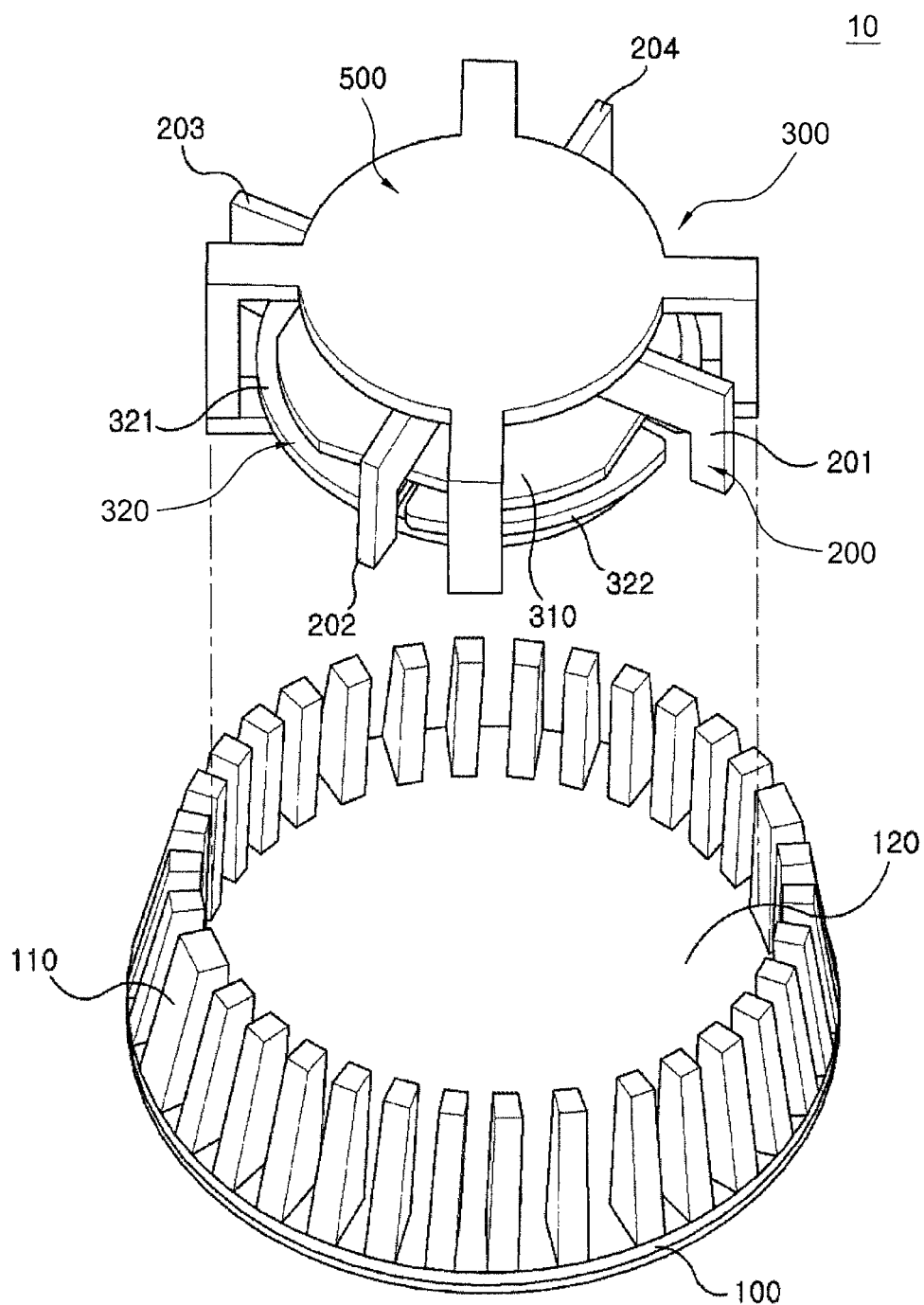
FIGS. 2A and 2B illustrate exploded perspective views of heat dissipating devices in accordance with a preferred embodiment of the present invention schematically and respectively.
Figure 2B:
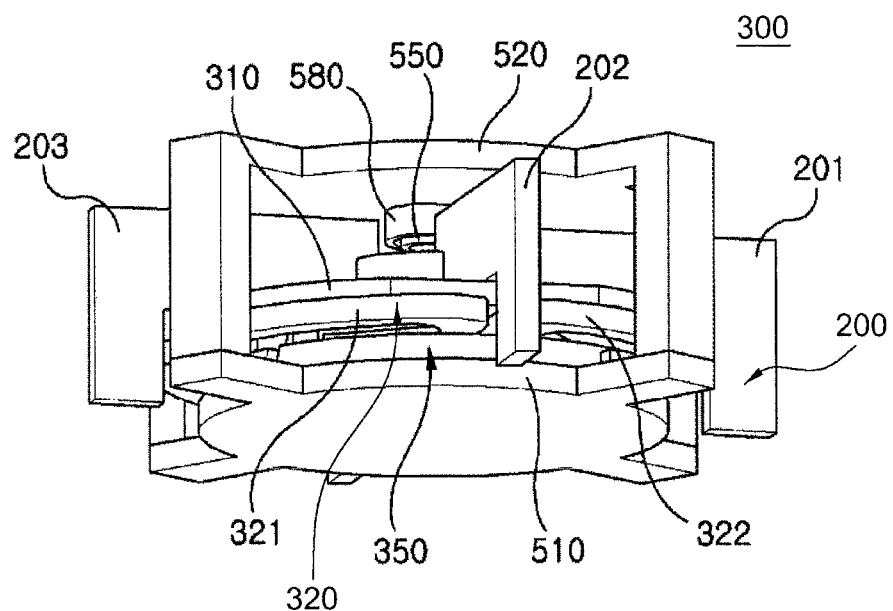
Figure 3:
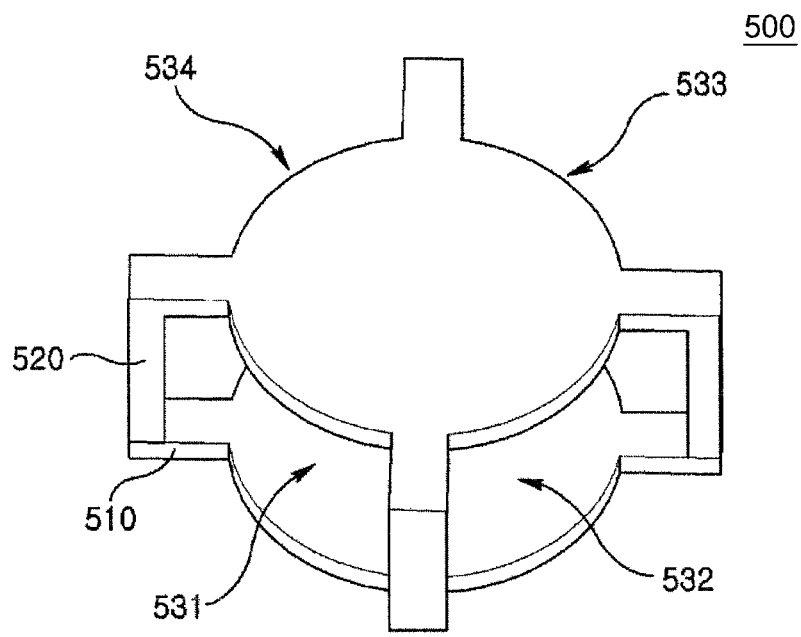
FIG. 3 illustrates a perspective view of a housing of a heat dissipating device in accordance with a preferred embodiment of the present invention, schematically.

FIGS. 2A and 2B illustrate exploded perspective views of heat dissipating devices in accordance with a preferred embodiment of the present invention schematically and respectively, and FIG. 3 illustrates a perspective view of a housing of a heat dissipating device in accordance with a preferred embodiment of the present invention, schematically.

Referring to FIG. 1, the heat dissipating device 10 can include a heat dissipating member or heat dissipater 100 thermally coupled to a heat generating unit or heat generator 150 (See FIG. 9) configured to transmit heat from the heat generating unit 150 to air, a blade 200 to be rotated, causing an air flow to at least a portion of the heat dissipating member 100, and a blade driving unit or blade drive 300 that causes the blade 200 to make alternating rotation within a preset range of angles by an electro-magnetic force generated between a magnet and a coil.

The heat dissipating member 100 can have one surface in contact with the heat generating unit 150, and the other surface provided with a plurality of heat dissipating fins 110 arranged at an edge thereof spaced from one another.

The heat from the heat generating unit 150 is transmitted to the heat dissipating fins 110 at the other surface of the heat dissipating member 100 through the one surface of the heat dissipating member 100 in contact with the heat generating unit 150. Thus, the heat dissipating member 100 can be provided with the heat dissipating fins 110 to have an increased contact surface with air for making effective transmission of the heat from the heat generating unit 150 to external air. The heat dissipating member 100 can also be called as a heat sink 100 in a view that the heat dissipating member 100 transmits the heat from the heat generating unit 150 to an outside of the device.

Referring to FIG. 2A, there is a space 120 formed on an inner side of the heat dissipating fins 110. That is, the space 120 is between the heat dissipating fins 110 and the other surface of the heat dissipating member 100, and the blade 200 and the blade driving unit 300 can be positioned in the space 120.

The blade 200 can be defined as a wing for producing an air flow. As shown in FIG. 1, the blade 200 can include a plurality of blades 201, 202, 203, and 204.

The plurality of blades 201, 202, 203, and 204 have rotation angles between first points ('moving left positions' in FIG. 7A), and second points ('moving right positions' in FIG. 7C), at which the plurality of blades 201, 202, 203, and 204 are to be positioned, respectively.

In a state the blade driving unit 300 is stationary, the plurality of blades 201, 202, 203, and 204 are positioned at middle of the first points and the second points (Neutral positions in FIG. 7B), respectively.

Figure 7A:
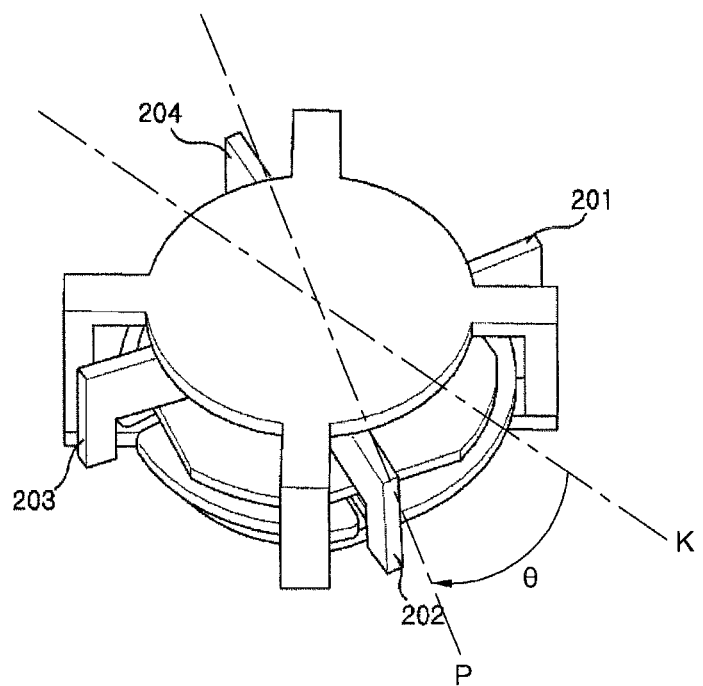
FIGS. 7A to 7C illustrate perspective views showing detailed operation of rotation of a blade in accordance with a preferred embodiment of the present invention, schematically.
Figure 7B:
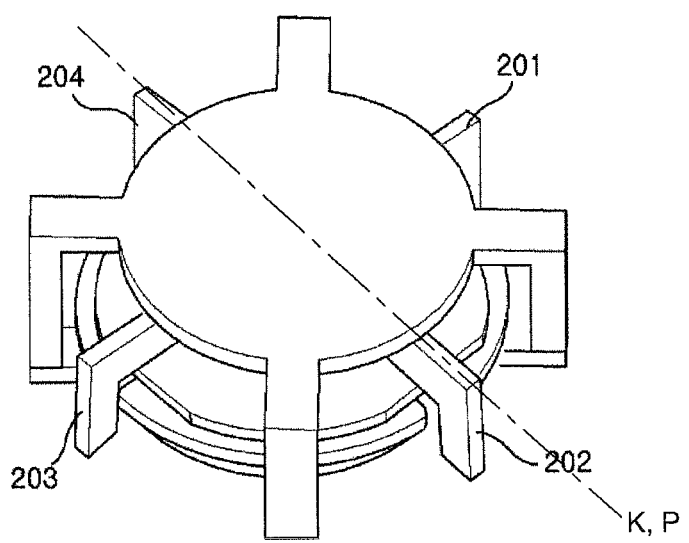

Referring to FIG. 7B, the blade 200 can be fixedly secured to a bobbin 310, wherein, a time when the plurality of blades 201, 202, 203, and 204 are at the middle of the first points and the second points respectively is defined that 'the bobbin 310 is at a neutral position'.

Upon putting the blade driving unit 300 into operation, the plurality of blades 201, 202, 203, and 204 rotate in a forward direction from the neutral position to the first points, respectively.

Then, repetitive alternate rotation is performed, in which the plurality of blades 201, 202, 203, and 204 rotate in a reverse direction from the first points to the second points respectively, and in a forward direction from the second points to the first points respectively, to cause an air flow in the space 120 for cooling the heat dissipating fins 110.

In this instance, an opposite side of the one surface of the heat sink 100 is the other surface, the space 120 is formed on the other side of the heat sink 100, and the heat dissipating fins 110, the blades 200, and the blade driving unit 300 are positioned on the other surface of the heat sink 100, constructing the heat dissipating device.

The heat generating unit is in contact with the one surface of the heat sink 100 permitting the heat to be dissipated from the heat generating unit to an outside of the heat dissipating device through the heat sink 100.

In this instance, since the heat dissipating fins 110 are arranged on an edge of the other surface of the heat sink 100, and the space 120 is on the inner side of the heat dissipating fins 110 arranged thus, the heat dissipating device 10 of the present invention is advantageous in that the heat transmitted to the heat dissipating fins 110 can be dissipated effectively by producing forced air flow on the inner side of the heat dissipating fins 110.

And, the heat generating unit 150 is defined as an electronic device which generates heat as the heat generating unit 150 is operated, and can be a light emitting apparatus {Particularly, an LED (Light Emitting Diode) lighting apparatus}, a control device {Particularly, a CPU (Central Processing Unit)}, a Backlight unit, a display device, a hard disk drive, a handheld terminal, a notebook computer, a computer module, or a projector.

As described before, the blade driving unit 300 serves to cause the blades 200 to make alternating rotation within a preset range of angle by the electromagnetic force generated between a magnet and a coil.

Referring to FIGS. 2A and 2B, the blade driving unit 300 has the bobbin 310, the coil 320, and the magnet 350 mounted to the housing 500. Though only one coil 320 and one magnet 350 can be provided depending on a system of the heat dissipating device, the embodiment can have a plurality of coils (321, and 322), and (323, and 324, See FIG. 4), and a plurality of magnets 351, 352, 353, and 354 (See FIG. 4).

And, the plurality of blades 201, 202, 203, and 204 can be connected to the bobbin 310.

The housing 500 has openings 531, 532, 533, and 534 for transmitting the air flow produced by the rotation of the plurality of blades 201, 202, 203, and 204 (See FIG. 3) to the heat dissipating fins.

The coil 320 can be wound on a guide portion of the bobbin 310.

The magnet 350 can be spaced from the coil 320.

Therefore, the blade driving unit 300 includes the housing 500, and the bobbin 310, the coil 320, and the magnet 350 can be mounted in the housing 500, and, as shown in FIG. 2A, the housing 500 can be mounted in the space 120 positioned on the inner side of the heat dissipating fins 110 of the heat sink 100.

The blade driving unit 300 will be described in more detail. As shown in FIG. 2B, the blade driving unit 300 can include an upper structure 520 of a container shape having openings in a side surface, and a lower structure 501 of a plat shape coupled to the upper structure 520.

On an inside of the housing 500 having the upper structure 520 and the lower structure 510, there can be the bobbin 310 having the coil wound on the guide portion, the magnet 350, and the plurality of blades 201, 202, 203, and 204.

The upper structure 520 has a shaft guide portion 580 formed thereon, and both the bobbin 310 and the magnet 350 have pass through holes formed therein, respectively. A shaft 550 can be placed in the shaft guide portion 580 and the pass through hole. The shaft 550 is fixedly secured to the pass through hole in the bobbin 310, and rotatably placed in the shaft guide portion 580 of the upper structure 520 and the shaft guide portion of the lower structure 510.

Therefore, the blade driving unit 300 is a driver which makes the bobbin 310 to move with electromagnetic force to rotate the plurality of blades 201, 202, 203, and 204 fixedly secured to the bobbin 310 in left and right directions.

That is, since the shaft 550 can be moved by external force, and the bobbin 310 is connected to the plurality of blades 201, 202, 203, and 204 and the shaft 550, if the bobbin 310 moves, the plurality of blades 201, 202, 203, and 204 and the shaft 550 move together, making the plurality of blades 201, 202, 203, and 204 to rotate in left and right directions alternately, at the end.

And, heat dissipated from the heat dissipating fins 110 remains in spaces between, or in the vicinity of, the heat dissipating fins 110. Since the air flow produced by the left and right direction alternate rotation of the plurality of blades 201, 202, 203, and 204 has a high pressure tending to direct toward the heat dissipating fins 110, the air flow can enhance efficiency of dissipation of the heat remained in the spaces between, or in the vicinity of, the heat dissipating fins 110.

Figure 4:
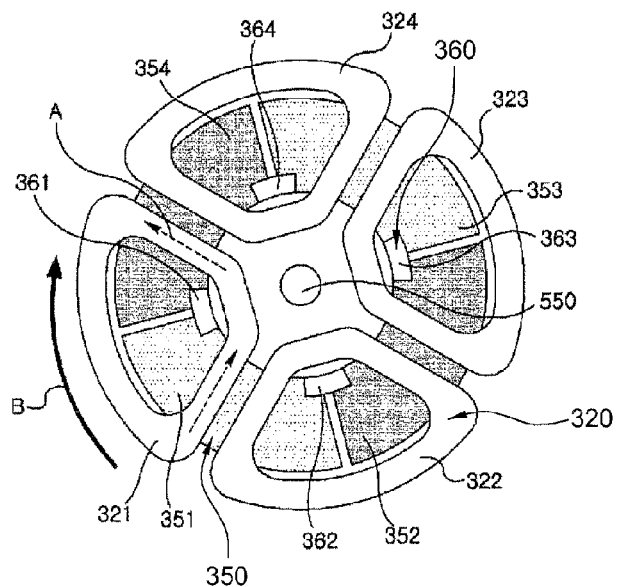
FIG. 4 illustrates a schematic view showing a relation between a magnet and a coil in a heat dissipating device in accordance with a preferred embodiment of the present invention.

FIG. 4 illustrates a schematic view showing a relation between the magnet and the coil in the heat dissipating device in accordance with the preferred embodiment of the present invention. FIG. 4 illustrates a state the bobbin 310 is at the neutral position.

In the embodiment, the magnet 350 is positioned under the coil 320 spaced from the coil 320. As shown in FIG. 4, the magnet 350 can include four magnets 351, 352, 353, and 354, and the coil 320 can include four coils 321, 322, 323, and 324.

It is preferable that each of the magnets 351, 352, 353, and 354 has single polarity of an N pole or an S pole, respectively. And, it is preferable that the magnets 351, 352, 353, and 354 arranged in succession such that polarities thereof are different from one another.

That is, it is preferable that the four magnets 351, 352, 353, and 354 are configured to have polarities thereof different from one another between adjacent magnets. Hereafter, it is assumed that magnets '351', and '353' have S polarities respectively, and magnets '352', and '354' have N polarities, respectively.

FIG. 4 illustrates the plurality of magnets 351, 352, 353, and 354 arranged to form a closed curve.

Referring to FIG. 4, at the time the bobbin 310 is at the neutral position, a portion of each of the four coils 321, 322, 323, and 324 wound on the guide portion and the other portion of each of the four coils 321, 322, 323, and 324 wound on the guide portion are positioned opposite to adjacent magnets, respectively.

That is, at the time the bobbin 310 is at the neutral position, a right side portion of the coil 321 is positioned opposite to the magnet 351, and a left side portion of the coil 321 is positioned opposite to the magnet 354. The other coils 322, 323, and 324 are identical, too. For convenience's sake, description will be made with regard to a correlation between the coil 321 and the magnet 351 and 354 only.

Since the magnet 354 has an N pole and the magnet 354 has an S pole, a left side portion of the coil 321 lies in a magnetic field coming out of the magnet 354, and a right side portion of the coil 321 lies in a magnetic field going into the magnet 354. That is, the left side portion of the coil 321 lies in a magnetic field formed upward vertically, and the right side portion of the coil 321 lies in a magnetic field formed downward vertically.

In this state, i.e., in the neutral state, if a current flows in an arrow direction A shown in FIG. 4, i.e., in an anti-clockwise direction, a Lorenz force which is a force acting on a charged particle moving in a magnetic field is acting on the coil 321. A direction of the force acting on the first coil 321 is according to the Fleming's left-hand rule.

In detail, the left side portion of the coil positioned over the magnet 354 has a north-east direction force acting thereon with reference to the drawing, and the right portion of the coil 321 positioned over the magnet 351 has a north-west direction force acting thereon with reference to the drawing.

In this instance, since the coil 321 is wound on the bobbin 310, and the bobbin 310 is fixedly secured to the shaft 550 so as to be rotatably centered on the shaft 550, the bobbin 310 has a force acting thereon tending to rotate the bobbin 310 in a clockwise direction (B direction in FIG. 4) centered on the shaft 550.

And, since the blade 200 is fixedly secured to the bobbin 310, the blade 200 also rotates in the clockwise direction following the rotation of the bobbin 310.

Opposite to this, if an opposite direction current, in an A direction, flows to the coil 321, making the electromagnetic force to act opposite to above, the bobbin 310 rotates in the anti-clockwise direction (an opposite direction of a B direction) centered on the shaft 550.

That is, since the shaft 550 connected to the bobbin 310 is movable by an external force, the shaft 550 is rotated in a forward or reverse direction according to movement of the bobbin 310.

At the end, the blade 200 connected to the bobbin 310 performs left/right direction alternate rotation to produce the air flow.

In this instance, the blade driving unit 300 of the present invention applies no driving force to the shaft 550 itself directly, but makes the bobbin 310 move by the electromagnetic force being applied to the coil 320 to rotate the blade 200. That is, the shaft 550 serves to provide a rotation axis to the bobbin 310.

As the forces acting on the other coils 322, 323, and 324 are similar to the force acting on the coil 321, detailed description of the forces will be omitted.

However, it is preferable that a direction of the current flowing to the coil 322 is opposite to the direction of the current flowing to the coil 321. If the direction of the current flowing to the coil 322 is the same with the direction of the current flowing to the coil 321, making a direction of the rotation force acting on the coil 321 opposite to the direction of the rotation force acting on the coil 322 to offset each other, a total rotation force acting on the bobbin 310 can be reduced.

Accordingly, it is preferable that, if the direction of the currents flowing to the coils 321 and 323 is in an A direction, the direction of the currents flowing to the coils 322 and 324 is opposite to the A direction.

Figure 5:
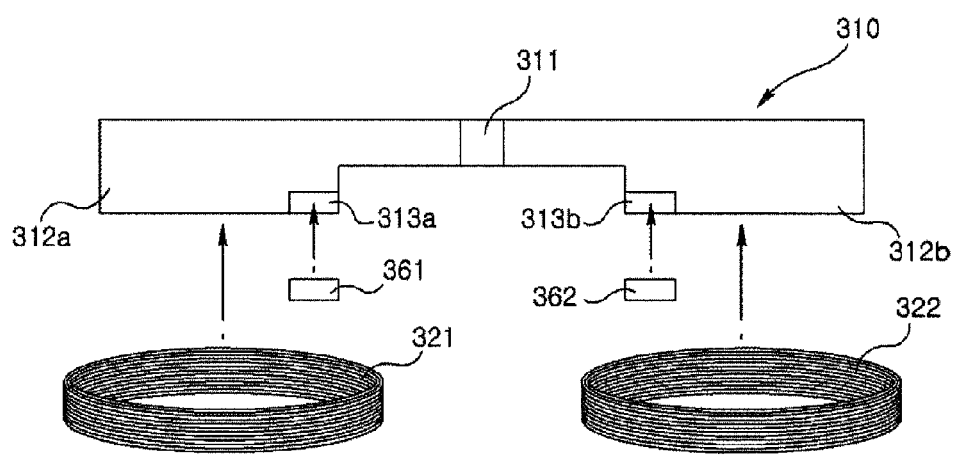
FIG. 5 illustrates a section showing a coil and a magnetic spring mounted to a bobbin in a heat dissipating device in accordance with a preferred embodiment of the present invention, schematically.

In the meantime, referring to FIGS. 4 and 5, the blade driving unit 300 in accordance with a preferred embodiment of the present invention is mounted to the bobbin 310 spaced from the plurality of magnets 351, 352, 353, and 354, and can further include magnetic spring members 360; 361, 362, 363, and 364 configured to apply a restoring force in a direction in which magnetic fluxes from the plurality of magnets 351, 352, 353, and 354 are minimum. This will be described with reference to FIGS. 4 and 5.

FIG. 5 illustrates a section showing a coil and a magnetic spring mounted to a bobbin in a heat dissipating device in accordance with a preferred embodiment of the present invention, schematically.

Referring to FIG. 5, there can be guide portions 312a and 312b formed on a lower side of the bobbin 310. For convenience's sake, the other two guide portions are not shown. The guide portions 312a and 312b can have the coils 321 and 322 wound thereon, respectively. And, the guide portions 312a and 312b can have recesses 313a and 313b formed therein, for placing the magnetic spring members 361 and 362 therein, respectively.

And, the bobbin 310 has a pass through hole 311 formed therein for placing the shaft 550 therein.

In this instance, it is preferable that the magnetic spring member 360 is an iron piece extended in a transverse direction.

Referring to FIG. 4, when the bobbin 310 is at the neutral position, it is preferable that a center line of the iron piece 360 is positioned opposite to a boundary line of adjacent magnets. In detail, the center line of the iron piece 361 is positioned on the boundary line of adjacent magnets 351 and 354, the center line of the iron piece 362 is positioned on the boundary line of adjacent magnets 352 and 351, the center line of the iron piece 363 is positioned on the boundary line of adjacent magnets 353 and 352, and the center line of the iron piece 364 is positioned on the boundary line of adjacent magnets 354 and 353.

In this instance, between the iron piece 360 and the magnet 350, there is a tendency to move to a point at which a size of the flux generated at the magnet 350 is minimum (a stable point at which energy is minimum).

In more detail, if the magnet 354 and the magnet 351 are taken as an example, the magnetic line starts from the magnet 354 which has the N pole and enters the magnet 351 which is the S pole, wherein the density of the magnetic line is minimum in the vicinity of a boundary line of the magnet 354 and the magnet 351. Therefore, when the iron piece 361 oscillates in the clockwise direction and the anti-clockwise direction, a sort of restoring force acts toward the boundary line of the magnet 354 and the magnet 351.

The nature in which the iron piece 360 tends to move to the point at which the size of the magnet flux is minimum can be defined as a principle of a magnetic spring.

Accordingly, even if no power is applied to the blade driving unit 300, the center line of the iron piece 360 is positioned at a point opposite to the boundary line of adjacent magnets by the magnetic spring principle, to maintain the neutral position of the blade 200 as shown in FIG. 7B.

Figure 6:
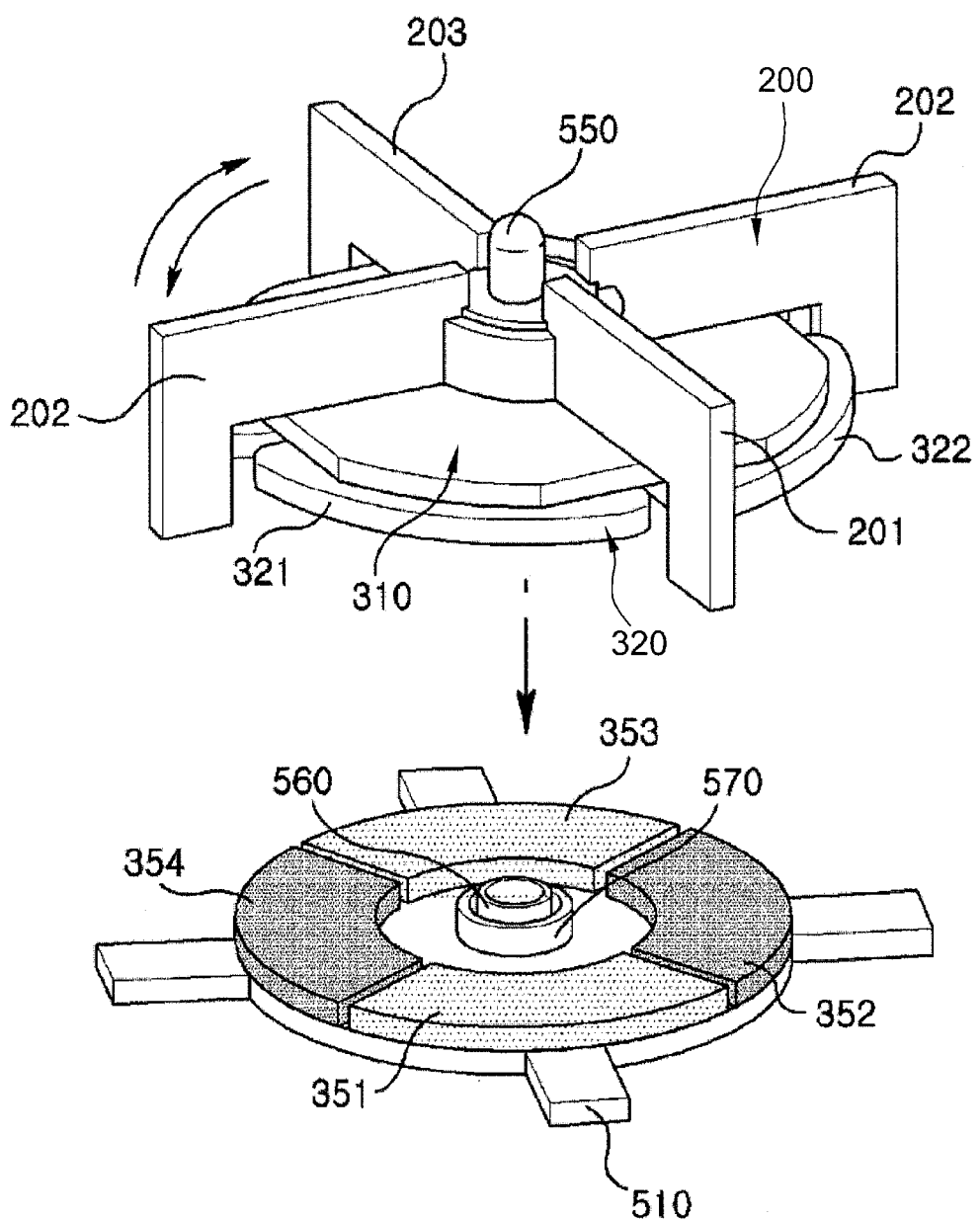
FIG. 6 illustrates a perspective view showing mounting of a bobbin and a magnet to a housing in a heat dissipating device in accordance with a preferred embodiment of the present invention, schematically.

FIG. 6 illustrates a perspective view showing mounting of a bobbin and a magnet to a housing in a heat dissipating device in accordance with a preferred embodiment of the present invention, schematically.

Referring to FIG. 6, the bobbin 310 can have the coils 321, and 322 provided to a lower side, and the blades 200 fixedly secured to an upper side.

The magnets 351, 352, 353, and 354 can be arranged in a circular band shape in succession secured to the lower structure 510 of the housing.

And, on inner sides of the magnets 351, 352, 353, and 354, there is a shaft guide portion 570 formed thereon for placing a lower portion of the shaft 550 therein, and the shaft guide portion 570 has a bearing placed therein for smooth rotation of the shaft 550 by an external force.

In this instance, the bobbin 310 having the iron pieces 361, and 362 mounted thereto and the blades 201, 202, 203, and 204 fixedly secured thereto is coupled to the lower structure 510 of the housing with the shaft 550. That is, the shaft 550, placed in the bobbin 310 fixedly, is coupled to the housing as one end of the shaft 550 is placed in the shaft guide portion 570 of the lower structure 510 of the housing.

Movement of the blade will be described in detail, with reference to FIGS. 7A to 7C and 8.

Figure 7C:
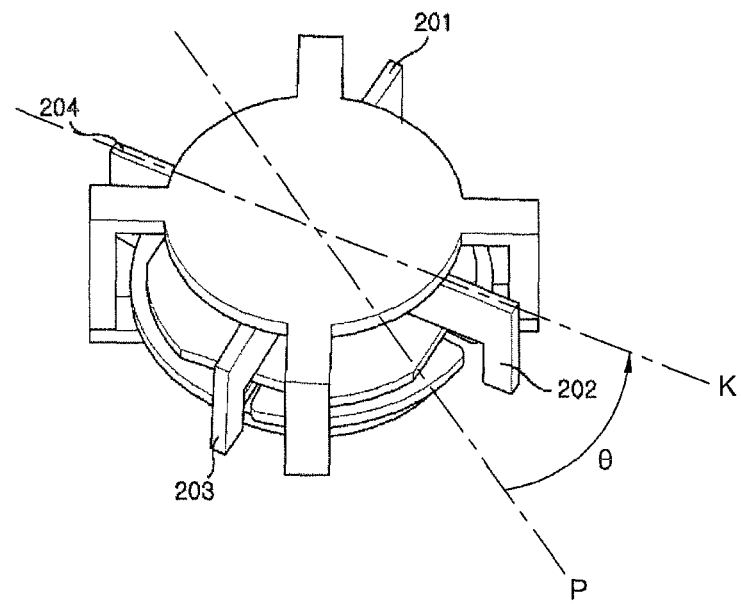
Figure 8:
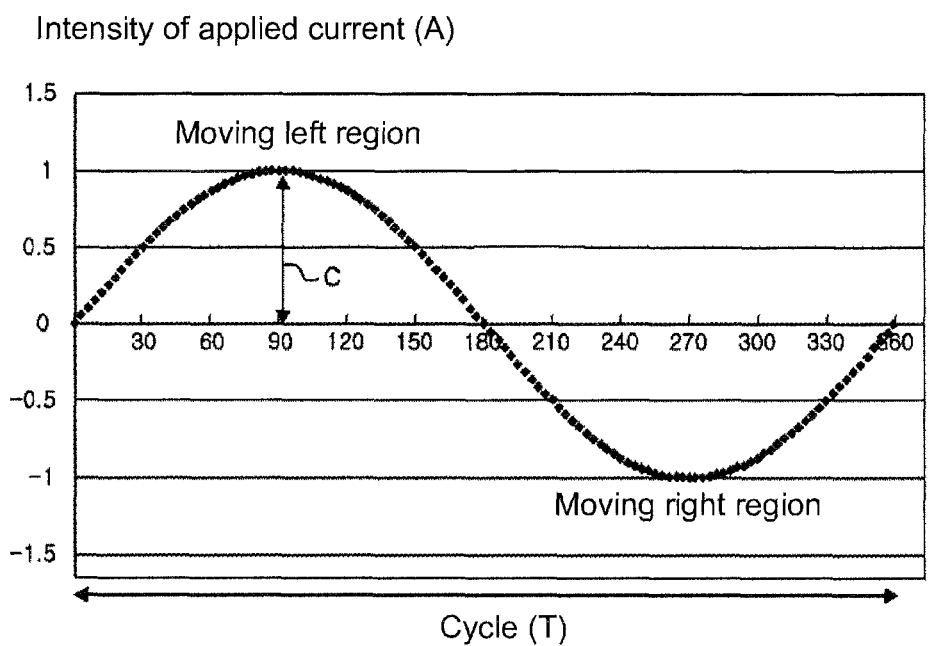
FIG. 8 illustrates a waveform of a current applied to a coil in accordance with a preferred embodiment of the present invention.

FIGS. 7A to 7C illustrate perspective views showing detailed operation of rotation of the blade in accordance with a preferred embodiment of the present invention schematically. And, FIG. 8 illustrates a waveform of a current applied to a coil in accordance with a preferred embodiment of the present invention.

As described before, a direction of force which rotates the coil 320 due to the magnet 350 and the coil 320 changes with a direction of the current flowing to the coil 320 and a direction of the magnetic field of the magnet 350. In this instance, since the magnet 320 is stationary, the magnetic field is consistent. Therefore, as shown in FIGS. 7A to 7C, in order to make the blade 200 to rotate in opposite directions alternately, it is required to change a direction of the current flowing to the coil 320 with time.

Therefore, it is preferable that the current flowing to the coil 320 is an alternating current when the blade driving unit 300 is in operation. In more detail, as shown in FIG. 8, it is preferable that the current has a waveform of a sinusoidal wave.

In the embodiment, as described before, since the coil 320 can include a plurality of coils 321, 322, 323, and 324, and it is preferable that the currents flowing to the coils 321, and 323 and to the coils 322, and 324 are opposite to each other, the embodiment will be described with reference to the current flowing to the coil 321 of the plurality of coils.

In the sinusoidal current wave form in FIG. 8, a direction of a force acting on the coil 321 when the current is a positive + direction wave is different from a direction of a force acting on the coil 321 when the current is a negative − direction wave.

In detail, when the current is the positive + direction wave, the force acts on the coil 321 such that the blade 200 is at a position shown in FIG. 7A, and when the current is the negative − direction wave, the force acts on the coil 321 such that the blade 200 is at a position shown in FIG. 7C. If a case the blade 200 is at a position shown in FIG. 7A is called as a moving left region, a case when the blade 200 is at a position shown in FIG. 7C can be called as a moving right region.

And, when the current is at a crossing point of the positive + direction wave and the negative − direction wave, since no force acts on the coil 321, the blade 200 will tend to move to a position shown in FIG. 7B, i.e., the neutral position.

Referring to FIG. 8, if the current has the sinusoidal wave form, oscillating between a maximum value and a minimum value of a preset range, the bobbin 310 makes alternating rotation centered on the shaft within a preset range of angle. Thus, as the blade 200 makes repetitive alternating rotation by the sinusoidal wave form current applied to the coil 321, the blade 200 produces forced convection.

Referring to FIGS. 7A to 7C, an angle θ of rotation of the bobbin 200 is defined as an angle from the neutral position of the bobbin 310 (a position line marked with 'P') to a position when the bobbin 310 is rotated to a maximum (a position line marked with 'K').

The strength of the force acting on the coil 321 owing to the magnet 350 and the coil 321 having the current flowing thereto is proportional to intensity of the current to the coil 321. That is, since the stronger the intensity of the current to the coil 321, as the force tending to rotate the coil 321 becomes the stronger, the rotating angle θ of the blade 200 can also become the greater.

And, since the shorter a cyclic time period of the sinusoidal wave form current to the coil 321, as a direction change of the force acting on the coil 321 will become the sharper, a rotating speed of the blade 200 will become the faster.

Therefore, it is preferable that the intensity and the cyclic time period of the current to the coil 321 are controllable.

That is, referring to FIG. 8, by controlling the intensity C of the sinusoidal wave form current, the angle θ of the blade 200 can be controlled, and by controlling the cyclic time period T of the sinusoidal wave form current, the rotating speed of the blade 200 can be controlled.

In this instance, it is preferable that the angle θ of the blade 200 meets a condition of $0° \leq \theta \leq 90°$.

Figure 9:
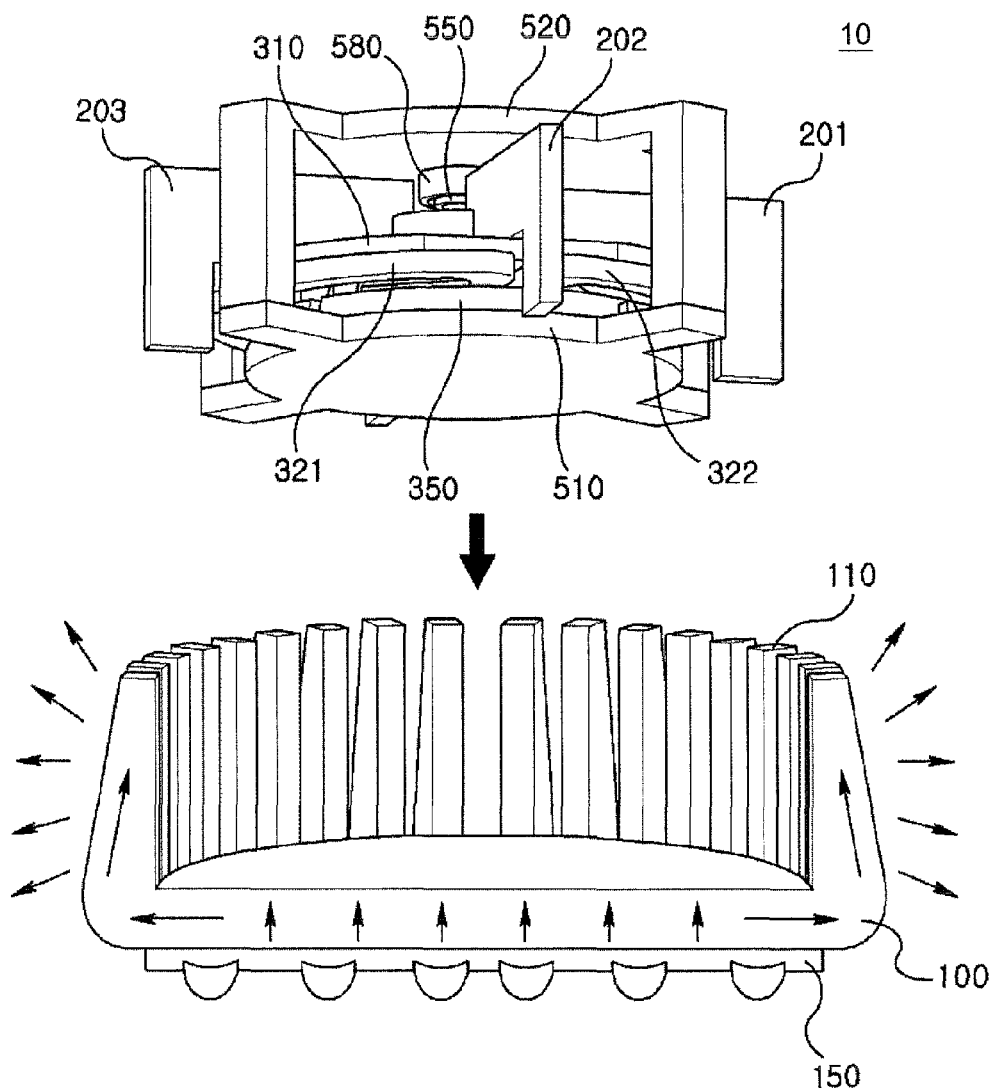
FIG. 9 illustrates a schematic view showing a state in which an LED lighting module is being mounted to a heat dissipating device in accordance with a preferred embodiment of the present invention.
Figure 10:
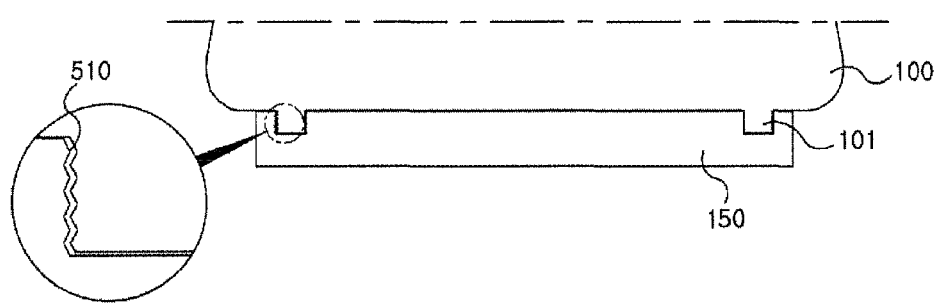
FIG. 10 illustrates a section showing an example of fastening of an LED lighting module to a heat sink, schematically.
Figure 11:
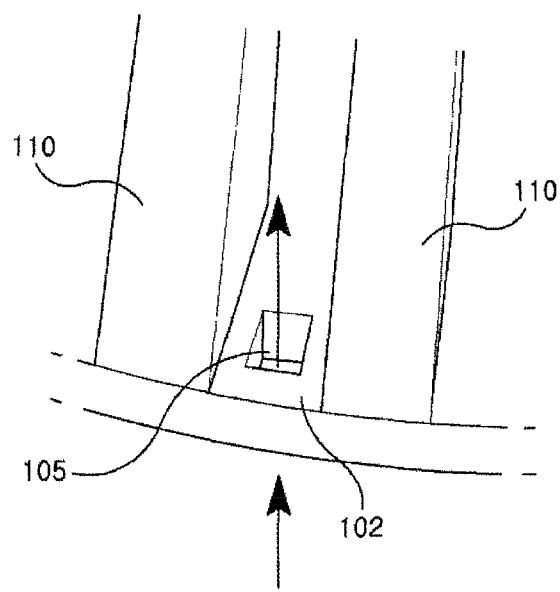
FIG. 11 illustrates a section showing a state an opening is formed between heat dissipation fins in a heat dissipating device in accordance with a preferred embodiment of the present invention, schematically.

An example in which the heat dissipating device 10 of the present invention is applied specifically will be reviewed with reference to FIGS. 9 to 11.

FIG. 9 illustrates a schematic view showing a state in which an LED lighting module is being mounted to a heat dissipating device in accordance with a preferred embodiment of the present invention, and FIG. 10 illustrates a section showing an example of fastening an LED lighting module and a heat sink together, schematically.

FIG. 11 illustrates a section showing a state an opening is formed between heat dissipation fins in a heat dissipating device in accordance with a preferred embodiment of the present invention, schematically.

As described before, the heat generating unit, defined as an electronic unit which generates heat as the electronic unit is driven, is in contact with the one surface of the heat sink of the heat dissipating device, and when the heat transmits from the heat generating unit to the heat dissipating fins 110 on the one surface of the heat sink 100, the air flow produced by the alternating rotation of the blades 201, 202, 203, and 204 can dissipate the heat transmitted to the heat dissipating fins 110, effectively.

As an example of the heat generating unit, FIG. 9 illustrates a heat dissipating device having an LED lighting module 150 applied thereto. FIG. 9 illustrates the heat sink 100 in a sectional view, with the blades 201, 202, 203, and 204 and other elements mounted in the heat sink 100 in a perspective view.

That is, the heat dissipating device can include a heat sink 100 having one surface and the other surface having heat dissipating fins 110 arranged on an edge thereof to form a space on an inner side of the heat dissipating fins, a plurality of blades 201, 202, 203, and 204 positioned in the space for causing an air flow by rotation to cool the heat dissipating fins 110, a driving unit for causing the plurality of blades 201, 202, 203, and 204 to make alternating rotation within a preset rotation angle by an electromagnetic force generated between a magnet and a coil, and an LED lighting module 150 having at least one LED in contact with the one surface of the heat sink 100.

In this instance, the LED lighting module 150 and the heat sink 100 are fastened with fastening means together, for an example, with a thread 510 as shown in FIG. 10.

However, the fastening means is not limited to the thread fastening, but can include equivalent fastening means which can fasten the LED lighting module 150 and the heat sink 100, together.

And, referring to FIG. 11, on the other surface of the heat sink 100 between adjacent heat dissipating fins 110, an opening 105 can be provided for enhancing efficiency of heat transmission from the LED lighting module 150 to the heat dissipating fins 110.

The opening 105 passes through from the one surface to the other surface 102 of the heat sink 100.

As has been described, the heat dissipating device of the present invention has the following advantages.

The forced air flow produced from the inner side of the heat dissipating fins permits to dissipate heat transmitted to the heat dissipating fins, effectively.

Moreover, the bringing of the high pressure air flow caused by the left and right direction alternating rotation of the blades into contact with the heat dissipating fins enhances heat dissipating efficiency of the heat remained at, and in the vicinity of, the heat dissipating fins.

Furthermore, the alternating rotation of the blades within a preset range of angle permits to make the heat dissipating device and the driving unit smaller.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A heat dissipating device comprising:
a heat dissipater thermally coupled to a heat generator, the heat dissipater being configured to transmit heat from the generator to air;
a blade that forms an air flow to at least a portion of the heat dissipater;
a blade drive that drives the blade to alternatingly rotate within a preset range of angles by an electromagnetic force;
wherein the blade drive includes a shaft, a bobbin connected to the shaft so as to be rotatable about a rotation axis of the shaft, the bobbin having the blade mounted to one side thereof, and an electromagnetic force generator having a coil configured to pass a current therethrough and at least one magnet spaced from the coil; and
wherein the heat dissipater has one surface in contact with the heat generator and an other surface with a plurality of heat dissipating fins provided on an edge thereof spaced from one another.

2. The heat dissipating device as claimed in claim 1, wherein the bobbin has a guide portion formed thereon with the coil wound thereon.

3. The heat dissipating device as claimed in claim 2, wherein the at least one magnet comprises a plurality of magnets each having a single pole arranged in succession such that adjacent magnets have polarities different from each other.

4. The heat dissipating device as claimed in claim 3, wherein the plurality of magnets are arranged to form a closed curve.

5. The heat dissipating device as claimed in claim 3, wherein, when the bobbin is at a neutral position, a portion and an other portion of the coil wound on the guide portion are positioned opposite to adjacent magnets, respectively.

6. The heat dissipating device as claimed in claim 5, wherein the current flowing to the coil at the time of operation of the blade drive is an alternating current.

7. The heat dissipating device as claimed in claim 6, wherein the current flowing to the coil has controllable intensity and a cyclic time period.

8. The heat dissipating device as claimed in claim 3, wherein the blade drive further includes a magnetic spring provided to the bobbin spaced from the plurality of magnets to have a restoring force applied thereto from the plurality of magnets in a direction density of the flux becomes minimum.

9. The heat dissipating device as claimed in claim 8, wherein the guide portion has a recess formed therein for placing the magnetic spring therein.

10. The heat dissipating device as claimed in claim 8, wherein the magnetic spring includes an iron piece, and the iron piece is positioned such that a center line of the iron piece is opposite to a boundary line of adjacent magnets when the bobbin is at the neutral position.

11. The heat dissipating device as claimed in claim 1, wherein the blade drive further includes a housing having an upper structure of a container shape with openings at a side thereof and a lower structure of a plate shape coupled to the upper structure,
wherein the shaft, the bobbin, and the electromagnetic force generator are provided in the housing.

12. The heat dissipating device as claimed in claim 11, wherein the upper structure and the lower structure have shaft guide portions formed therein for rotatably placing the shaft therein respectively, the bobbin and the at least one magnet have pass through holes formed therein for placing in and passing through of the shaft respectively, and the shaft is fixedly secured to the pass through hole in the bobbin.

13. The heat dissipating device as claimed in claim 1, wherein the blade and the blade drive are positioned in a space formed between the other surface of the heat dissipater and the heat dissipating fins.

* * * * *